US010892327B2

(12) United States Patent
Soares et al.

(10) Patent No.: US 10,892,327 B2
(45) Date of Patent: Jan. 12, 2021

(54) SEMI-METAL RECTIFYING JUNCTION

(71) Applicant: University College Cork, Cork City (IE)

(72) Inventors: Alfonso Sanchez Soares, Cork City (IE); James Greer, Cork City (IE)

(73) Assignee: University College Cork, Cork City (IE)

( * ) Notice: Subject to any disclaimer, the term of this patent is extended or adjusted under 35 U.S.C. 154(b) by 0 days.

(21) Appl. No.: 15/759,896

(22) PCT Filed: Sep. 12, 2016

(86) PCT No.: PCT/EP2016/071408
§ 371 (c)(1),
(2) Date: Mar. 14, 2018

(87) PCT Pub. No.: WO2017/046023
PCT Pub. Date: Mar. 23, 2017

(65) Prior Publication Data
US 2018/0269280 A1 Sep. 20, 2018

(30) Foreign Application Priority Data

Sep. 14, 2015 (GB) .................................. 1516246.4
Apr. 5, 2016 (GB) .................................. 1605814.1

(51) Int. Cl.
*H01L 29/06* (2006.01)
*B82Y 10/00* (2011.01)
(Continued)

(52) U.S. Cl.
CPC ............ *H01L 29/068* (2013.01); *B82Y 10/00* (2013.01); *B82Y 40/00* (2013.01);
(Continued)

(58) Field of Classification Search
CPC ....... H01L 29/0669–068; H01L 29/872; H01L 29/1606; H01L 29/7391
See application file for complete search history.

(56) References Cited

U.S. PATENT DOCUMENTS 4,755,484 A 7/1988 Curran
5,449,561 A 9/1995 Golding et al.
(Continued)

FOREIGN PATENT DOCUMENTS

WO 2009158117 A2 12/2009
WO 2016048306 A1 3/2016
(Continued)

OTHER PUBLICATIONS

International Search Report issued in PCT Application Serial No. PCT/EP2016/071408 dated Dec. 9, 2016.
(Continued)

*Primary Examiner* — Mamadou L Diallo
(74) *Attorney, Agent, or Firm* — Michael T. Abramson; Holland & Knight LLP (57) ABSTRACT

A rectifying junction (15) is formed in a conduction path provided in a material (1). A size of the material (1) is smaller than a threshold size in a first dimension, the threshold size being the size required for the material (1) to exhibit sufficient quantum confinement such that it forms a semiconductor. A surface of a first region (17) of the material (1) is arranged to decrease the bandgap of the material such that the first region is conducting. A surface of a second region (19) of the material (1) is arranged to preserve a bandgap such that the second region is semiconducting. The second region (19) is contiguous to the first region (17), such that a rectifying junction (15) is formed at a boundary (21) between the first region and the second region.

19 Claims, 7 Drawing Sheets

(51) Int. Cl.
*H01L 29/36* (2006.01)
*B82Y 40/00* (2011.01)
*H01L 29/16* (2006.01)
*H01L 29/739* (2006.01)
*H01L 29/872* (2006.01)
*H01L 29/66* (2006.01)

(52) U.S. Cl.
CPC ...... *H01L 29/0669* (2013.01); *H01L 29/1606* (2013.01); *H01L 29/36* (2013.01); *H01L 29/66977* (2013.01); *H01L 29/7391* (2013.01); *H01L 29/872* (2013.01)

(56) References Cited

U.S. PATENT DOCUMENTS

| | | |
|---|---|---|
| 5,599,733 A | 2/1997 | Wan et al. |
| 5,684,778 A | 11/1997 | Yamada et al. |
| 5,686,351 A | 11/1997 | Golding et al. |
| 5,804,463 A | 9/1998 | Tregligas et al. |
| 6,086,673 A | 7/2000 | Molnar |
| 6,563,185 B2 | 5/2003 | Moddel et al. |
| 6,557,659 B1 | 6/2003 | Razeghi |
| 6,786,649 B2 | 6/2004 | Moddel et al. |
| 7,105,852 B2 | 9/2006 | Moddel et al. |
| 7,385,697 B2 | 6/2008 | Woollam et al. |
| 7,595,500 B2 | 9/2009 | Moddel et al. |
| 7,722,422 B2 | 5/2010 | Cok |
| 7,727,504 B2 | 6/2010 | Kittrell et al. |
| 7,839,910 B2 | 11/2010 | Asada et al. |
| 8,089,997 B2 | 1/2012 | Asada et al. |
| 8,274,729 B2 | 9/2012 | Luten et al. |
| 8,298,856 B2 | 10/2012 | Garnett |
| 8,306,084 B2 | 11/2012 | Reill et al. |
| 8,369,370 B2 | 2/2013 | Lell et al. |
| 8,580,602 B2 | 11/2013 | Garnett |
| 8,617,669 B1 | 12/2013 | Quick et al. |
| 8,664,524 B2 | 3/2014 | Garnett |
| 8,773,069 B2 | 7/2014 | Tanno |
| 8,786,053 B2 | 7/2014 | D'Evelyn et al. |
| 8,828,783 B2 | 9/2014 | Garnett |
| 8,841,164 B2 | 9/2014 | Steiger et al. |
| 8,946,865 B2 | 2/2015 | D'Evelyn et al. |
| 8,951,895 B2 | 2/2015 | Brenner et al. |
| 8,964,808 B2 | 2/2015 | Lell et al. |
| 8,994,035 B2 | 3/2015 | Simin et al. |
| 9,039,940 B2 | 5/2015 | Kim et al. |
| 9,059,299 B2 | 6/2015 | Steiger et al. |
| 9,076,825 B2 | 7/2015 | Yamamoto et al. |
| 9,105,658 B2 | 8/2015 | Yamazaki |
| 9,112,087 B2 | 8/2015 | Wertsberger et al. |
| 9,112,460 B2 | 8/2015 | Okamoto et al. |
| 2009/0236609 A1 | 9/2009 | de Heer et al. |
| 2012/0068152 A1 | 3/2012 | Hwang et al. |
| 2016/0064221 A1* | 3/2016 | Colinge .............. H01L 29/1033 257/192 |
| 2016/0071970 A1 | 3/2016 | Hatcher et al. |
| 2017/0271501 A1* | 9/2017 | Avci .................. H01L 29/7391 |

FOREIGN PATENT DOCUMENTS

| | | | |
|---|---|---|---|
| WO | 2016048377 A1 | 3/2016 | |
| WO | WO-2016048306 A1 * | 3/2016 | ......... H01L 29/7391 |

OTHER PUBLICATIONS

Hassan Walid M I et al, "Oxygen oassivation as effective technique for tailoring the nature of band gap of silicon nanowires", 2015 IEEE 15th International Conference on Nanotechnology (IEEE-NANO), IEEE, Jul. 27, 2015.

Li et al., "A new routine to fabricate Bi single crystalline tapering junction nanowire arrays", Applied Physics a Materials Science & Processing, Springer Berlin Heidelberg.

Zhou et al., "Functionalized graphene nanoroads for quantum well device", Applied Physics Letters, AIP Publishing LLC, US.

Bhandary et al., "Controlling Electronic Structure and Transport Properties of Zigzag Graphene Nanoribbons by Edge Functionalization with Fluorine", The Journal of Physical Chemistry, 2015 American Chemical Society.

Mohammad, "Understanding quantum confinement in nanowires: basics, applications and possible laws" Journal of Physics: Condensed Matter, Institute of Physics Publishing.

GB Search Report under Section 17 in GB Application Serial No. GB1605814,1 dated Jul. 22, 2016 in related GB application.

Ansari et al., "Tin Nanowire Field Effect Transistor", ESSDERC 2012—4nd European Solid State Device Research Conference, 2012, IEEE.

* cited by examiner

SEMI-METAL RECTIFYING JUNCTION

CROSS-REFERENCE TO RELATED APPLICATIONS

The subject application is a U.S. National Stage application of International Application No. PCT/EP2016/071408, filed on Sep. 12, 2016, which claims the priority of Great Britain Patent Application No. 1516246.4, filed Sep. 14, 2015 and also claims the benefit of Great Brian Patent Application No. 1605814.1, filed Apr. 5, 2016. The contents of all applications are herein incorporated by reference in their entirety.

The present invention relates to a rectifying junction and electronic devices incorporating the rectifying junction. In particular, but not exclusively, the present invention relates to a rectifying junction formed by surface modification of semimetal structures with reduced dimensionality such as nanowires (1D) or thin films (2D).

Generally, a rectifying junction (or diode) is a two terminal electronic device that allows current to flow for a first voltage polarity, but restricts the current flow for the opposite voltage polarity.

Rectifying junctions are a fundamental building block of modern electronics, and are key to electronic devices such as transistors.

Typically, rectifying junctions in transistors may be formed by doping, or compositional variations. With the ongoing demand to reduce the size of devices, transistors are approaching dimensions smaller than 10 nm. At these sizes, it becomes increasingly challenging to form rectifying junctions by doping or compositional variation, as small variations in material composition, or small amounts of impurities, can have significant effects.

According to a first aspect of the invention, there is provided a rectifying junction formed in a conduction path provided in a material, wherein: a size of the material is smaller than a threshold size in a first dimension, the threshold size being the size required for the material to exhibit sufficient quantum confinement such that it forms a semiconductor; a surface of a first region of the material is arranged to decrease the bandgap of the material such that the first region is conducting; and a surface of a second region of the material is arranged to preserve a bandgap such that the second region is semiconducting, wherein the second region is contiguous to the first region, such that a rectifying junction is formed at a boundary between the first region and the second region.

The rectifying junction is formed by changes in surface chemistry, and so the effect of small changes in doping or composition do not impact the junction. This means that a rectifying junction can be made at the sub 10 nm scale, and devices incorporating the junction can be made at the sub 10 nm scale, in a reliable and repeatable manner.

The surface of the first region and the surface of the second region may extend at least substantially parallel to the conduction path, and the path is provided in: a circular cross-section nanowire having diameter less than the threshold size and a length; or a non-circular cross section nanowire with associated widths less than the threshold size and a length; or a thin film having a thickness below the threshold size, and a length.

In use, a direction of conduction along the conduction path may extend along the length of the nanowire or thin film.

The first region and the second region may be arranged such that the boundary between the first region and the second region extends perpendicular to a direction of conduction along the conduction path.

The material may be a material that behaves as a semimetal in the bulk.

The material may be an elemental semimetal, compound semimetal, or alloy of two or more materials. The material may be selected from a list including: alpha-tin, arsenic, graphene, graphite, antimony, bismuth, mercury telluride, and tin-germanium alloy.

Bonds at the surface of the first region may be terminated by terminating groups or a passivating layer arranged to decrease the bandgap of the material in the first region. The terminating group or passivating layer may be arranged to decrease the bandgap of the material in the first region may be one or more of: Fluorine, or hydroxyl.

Bonds at the surface of the second region may be terminated by terminating groups or a passivating layer to narrow, maintain or widen the bandgap of the material in the second region, such that the second region maintains semiconducting behaviour. The terminating group or passivating layer may be arranged to narrow, maintain or widen the bandgap of the material in the second region of the surface may be one or more of methyl groups or hydrogen.

Bonds on the surface of the first region and/or the second region may be terminated by a mixture of terminating groups or passivating layers arranged to decrease the bandgap of the material, and terminating groups or passivating layers arranged to maintain or widen the bandgap of the material, in order to tune the bandgap of the first region and/or the second region.

According to a second aspect of the invention, there is provided an electronic device comprising at least one rectifying junction according to the first aspect.

The rectifying junction is formed by changes in surface chemistry, and so the effect of small changes in doping or composition do not impact the junction. This means that devices incorporating the junction can be made at the sub 10 nm scale, in a reliable and repeatable manner.

The electronic device may be a diode or a field effect transistor.

The electronic device may be a field effect transistor having a channel region extending between a source region and a drain region. The junction between the source region and the channel region and/or the junction between the drain region and the channel region may be formed by the rectifying junction. The surface of the channel region may be arranged such that the channel region is semiconducting.

The source region, the drain region and the channel region may all be smaller than the threshold size in the first dimension.

The electronic device may be a field effect transistor. A surface of a first of the source region and the drain region may be arranged to be conducting, such that a rectifying junction is formed between the one of the source region and drain region and the channel region. A surface of the other of the source region and the drain region may be arranged to be semiconducting. The other of the source region and the drain region may be doped to alter the band alignment such that a tunnel junction is formed between the channel region and the other of the source region and drain region.

The electronic device may be a Schottky barrier field effect transistor. The channel region, and one of the source region and the drain region may be smaller than the threshold size in a first dimension. The surface of the one of the source region and the drain region may be arranged to decrease the bandgap of the material such that the path is conducting in the one of the source region and the drain region, such that a rectifying junction may be formed between the one of the source region and drain region and the channel region. The other of the source region and the drain region may be larger than the threshold size in the first dimension, such that it is conducting.

According to a third aspect of the invention, there is provided a method of forming a rectifying junction comprising the steps of: providing a material that is smaller than a threshold size in a first dimension, the threshold size being the size required for the material to exhibit sufficient quantum confinement such that it forms a semiconductor; arranging a surface of a first region of the material to decrease the bandgap of the first region, such that it is conducting in the first region; and arranging a surface of a second region to be semiconducting, wherein the second region is contiguous to the first region, such that a rectifying junction is formed at a boundary between the first region and the second region.

By the method, a rectifying junction is formed by changes in surface chemistry, and so the effect of small changes in doping or composition do not impact the junction. This means that a rectifying junction can be made at the sub 10 nm scale, and devices incorporating the junction can be made at the sub 10 nm scale, in a reliable and repeatable manner.

Providing a material that is smaller than a threshold size in a first dimension may comprise: providing a material that is larger than the threshold size in all dimensions; and reducing the size of the material in the first dimension, such that it is smaller than the threshold size.

Arranging a surface of a first region and/or arranging a surface of a second region may include: chemically modifying the surface of the first region and/or the surface of the second region to modify the passivation of the bonds on the surface of the first region and/or second region.

Chemically modifying the surface of the first region may comprise: providing terminating groups or a passivating layer to passivate the bonds on the surface of the first region, the terminating groups arranged to decrease the bandgap of the material in the first region, such that the first region is conducting.

Chemically modifying a surface of the second region may comprise: providing terminating groups or a passivating layer to passivate the bonds on the surface of the second region, the terminating groups arranged to maintain or increase the bandgap of the material in the second region, such that the second region is semiconducting.

The material may comprise a material that behaves as a semimetal in the bulk.

It will be appreciated that optional features discussed in relation to any of the above aspects, may be applied to all of the above aspects in a similar manner.

There now follows, by way of example only, a description of embodiments of the invention, described with reference to the accompanying drawings, in which:

FIG. 5B illustrates the device of FIG. 5A, end on;

Figure 1A:
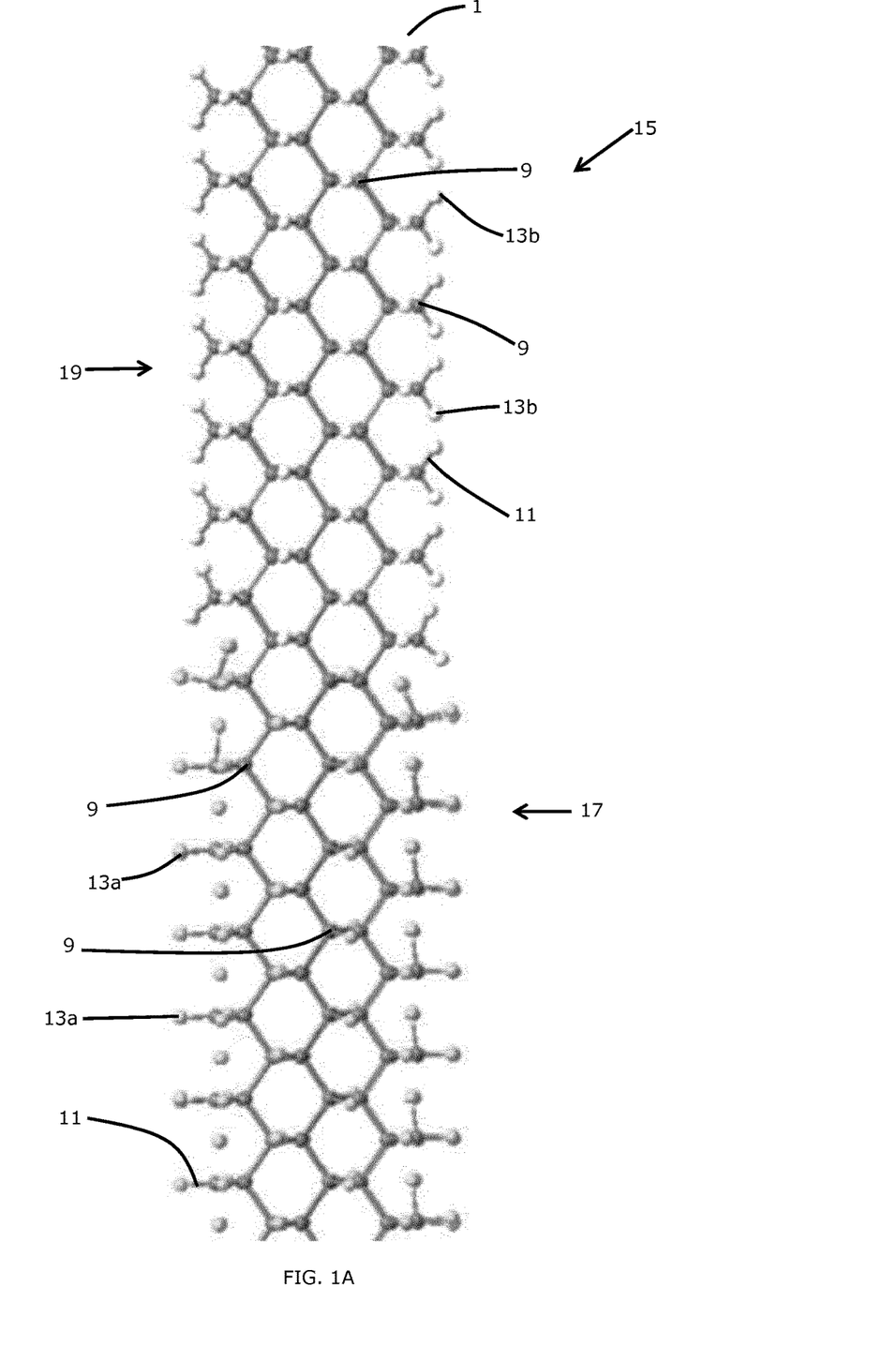
FIG. 1A illustrates a graphical representation of a nanowire incorporating a rectifying junction according to the invention.

FIG. 1A illustrates a graphical representation of a nanowire 1, showing a representation of the constituent atoms forming the nanowire 1. A nanowire 1 is an elongate cylindrical structure having a diameter 7 on a nanometre scale. FIG. 1A shows only a section of the length of a nanowire 1, for illustrative purposes.

The body 3 of the nanowire 1 is formed from a crystalline structure of atoms 9. The atoms 9 of the crystalline structure are able to bond to a number of other atoms 9 at the same time. In the body 3 of the nanowire 1, the atoms 9 bond only to constituent atoms of the crystalline structure.

However, at the surface 5, there are not sufficient atoms 9 to form all the necessary bonds. This leaves so called "dangling bonds" 11 or surface bonds. For the nanowire 1 to be stable, the surface bonds 11 have to be terminated by different atoms or groups, called terminating groups 13. The terminating groups 13 only need to form a single bond, and so can be used to terminate the surface bonds 11. This has the effect of passivating the surface.

The nanowire 1 is formed from a material that changes its conducting behaviour when the nanowire 1 is below a threshold diameter (critical diameter). The properties of the nanowire 1 above the threshold diameter are the bulk properties of the material from which the nanowire 1 is made. In the bulk, the nanowire has no or low quantum confinement, and is metallic or semimetallic (metalloid). Below the threshold diameter, the nanowire 1 exhibits sufficient quantum confinement for a bandgap to form, and for the nanowire 1 to be semiconducting. The threshold diameter is the same as or less than the Fermi wavelength of the carriers in the material. The Fermi wavelength is the characteristic scale above which electrons and holes behave as bulk charge carriers. Below the Fermi wavelength, the quantum confinement is predominant. This behaviour is determined with a default terminating group 13, such as hydrogen, which is the terminating group formed under many conditions.

Figure 1B:
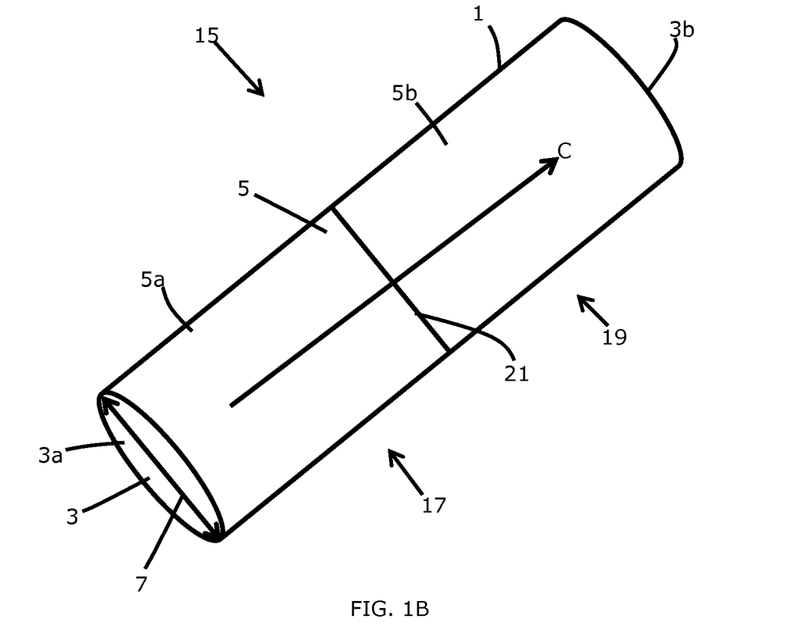
FIG. 1B illustrates a schematic representation of a nanowire incorporating a rectifying junction according to the invention.

In a first embodiment of the invention, a rectifying junction 15 is formed from a nanowire 1 that has a diameter below the threshold diameter, and so is semiconducting.

To form the rectifying junction, the nanowire 1 is split into a first region 17 and a second region 19. The division is perpendicular to the length of the nanowire 1, so that the first region 17 is formed along a first portion of the length of then nanowire 1, and the second region 19 is formed along a second portion of the length of the nanowire 1, joining to the first portion.

The surface bonds 11 on the surface of the first region 17 are terminated by a first type of terminating group 13*a*. The first type of terminating group 13*a* is selected so that it reduces or closes the bandgap in the first region 17, so that the first region 17 reverts to metallic or semimetallic conducting properties.

The surface bonds 11 on the surface of the second region 19, which is next to and contiguous with the first region 17 are terminated by a second type of terminating group 13b. The second type of terminating group 13b is selected to maintain or increase the bandgap, so that the second region 19 is semiconducting. The second type of terminating group 13b may also narrow the bandgap, provided it maintains the semiconducting behaviour.

A boundary 21 is formed between the conducting first region 17 and the semiconducting second region 19. In use, conduction occurs along the length of the nanowire 1, so the nanowire 1 defines a conduction path along which conduction can occur. The conduction path crosses the boundary 21.

The nanowire 1 can be made from a number of different materials. In one example, the nanowire 1 is made of alpha-tin with the [110] crystallographic orientation along the length of the nanowire 1. From density functional theory (DFT) calculations, the threshold diameter for showing sufficient quantum confinement for alpha-tin [110] to be semiconducting is approximately 4 nm, so an alpha-tin [110] nanowire 1 should be less than 4 nm in diameter.

In other examples, instead of tin, the nanowire 1 may be an elemental semimetal, a compound semimetal or a semimetal alloy. For example, the nanowire 1 may be arsenic, a semimetallic carbon allotrope (for example graphene or graphite), antimony, bismuth, mercury telluride, or tin-germanium alloy.

In general, any of the possible materials will exhibit quantum confinement when the diameter of the nanowire is below the threshold size.

A wide variety of different terminating groups may also be used. For example, a methyl group ($CH_3$), hydroxyl group (OH), hydrogen or Fluorine may be used.

Table 1 shows some examples of the effect of different terminating groups on the bandgap of 1 nm diameter alpha-tin nanowires. Table 2 shows the effect of different terminating groups on the bandgap of 3 nm diameter alpha-tin nanowires.

TABLE 1

Bandgap ($E_g$), conducting behaviour (SC = semiconducting, C—conducting) and electron affinity ($\chi$) for Methyl, Hydrogen, Hydroxyl and Fluorine terminating groups for a 1 nm alpha-tin nanowire, with different crystal orientations.

| | <100> orientation | | <110> orientation | | <111> orientation | |
|---|---|---|---|---|---|---|
| | $E_g$ (eV) | $\chi$ (eV) | $E_g$ (eV) | $\chi$ (eV) | $E_g$ (eV) | $\chi$ (eV) |
| Methyl | 1.33 (SC) | 3.25 | 0.54 (SC) | 3.71 | 0.88 (SC) | 3.33 |
| Hydrogen | 1.61 (SC) | 3.63 | 0.68 (SC) | 4.24 | 1.12 (SC) | 3.70 |
| Hydroxyl | 0.57 (SC) | 5.42 | 0.02 (C) | 5.30 | 0.40 (SC) | 5.35 |
| Fluorine | 0.14 (SC) | 7.47 | 0.03 (C) | 7.21 | 0.07 (C) | 7.55 |

TABLE 2

Bandgap ($E_g$), conducting behaviour (SC = semiconducting, C—conducting) and electron affinity ($\chi$) for Methyl, Hydrogen, Hydroxyl and Fluorine terminating groups for a 3 nm alpha-tin nanowire, with different crystal orientations.

| | <100> orientation | | <110> orientation | | <111> orientation | |
|---|---|---|---|---|---|---|
| | $E_g$ (eV) | $\chi$ (eV) | $E_g$ (eV) | $\chi$ (eV) | $E_g$ (eV) | $\chi$ (eV) |
| Methyl | 0.19 (SC) | 3.90 | 0.03 (C) | 4.03 | 0.06 (C) | 3.85 |
| Hydrogen | 0.24 (SC) | 4.44 | 0.06 (C) | 4.64 | 0.03 (C) | 4.52 |
| Hydroxyl | 0.18 (SC) | 5.76 | 0.04 (C) | 5.16 | 0.21 (SC) | 5.54 |
| Fluorine | 0 (C) | 7.27 | 0 (C) | 7.06 | 0.16 (SC) | 7.15 |

In general, any material may be used that passivates the surface by saturating the surface bonds, and which has the desired effect on the bandgap. The person skilled in the art will readily appreciate the techniques required to determine the bandgap and electron affinities of different terminating groups, and hence the surface chemistries of different terminating groups. A rectifying junction will be formed where the nanowire 1 is of a size such that there existing different terminating groups where the bandgap can be conducting or semiconducting depending on the surface terminating group.

Figure 2A:
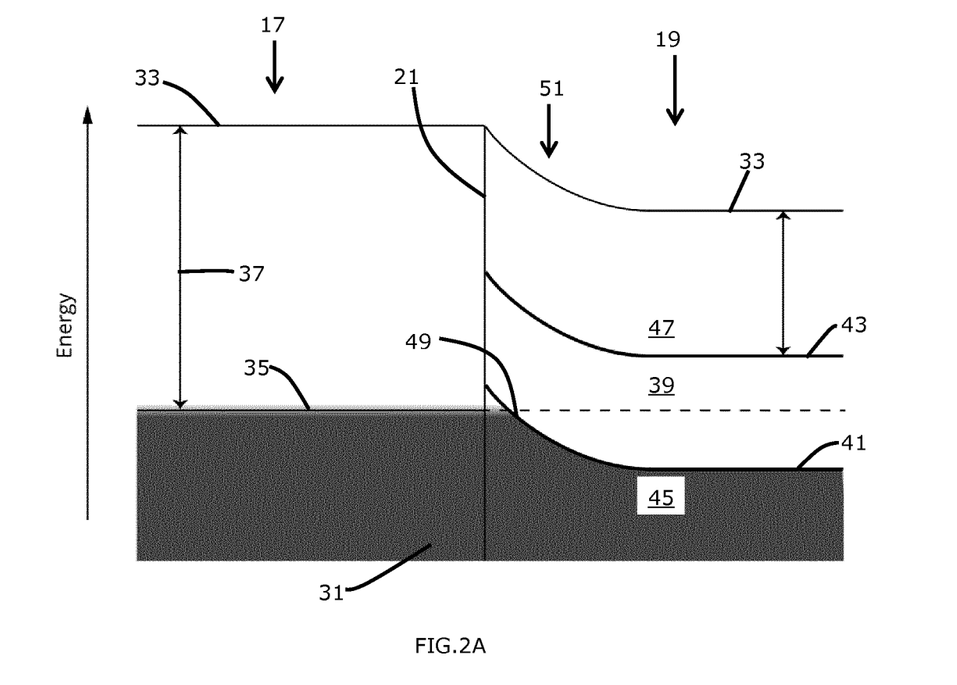
FIG. 2A schematically illustrates an energy level diagram of a rectifying junction with p-type band alignment according to the invention.
Figure 2B:
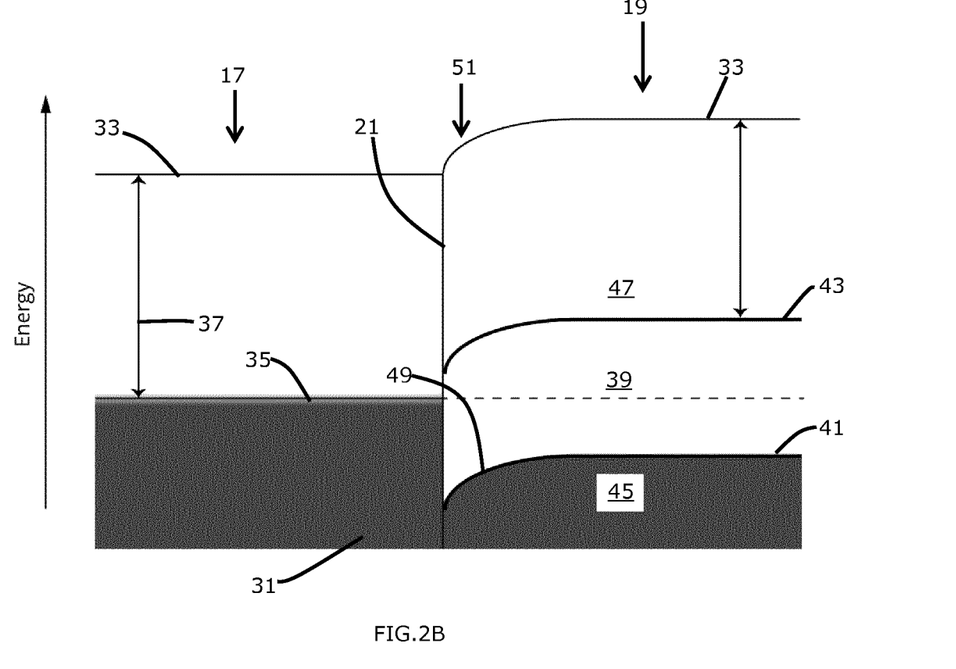
FIG. 2B schematically illustrates an energy level diagram of a rectifying junction with n-type band alignment according to the invention.

FIGS. 2A and 2B show examples of an energy band diagram of two alpha-tin nanowires 1 grown or formed along the [110] crystallographic direction, with 1 nm diameter. In both cases, the nanowire 1 has a first region 17 that has fluorine surface terminating groups 13a, such that it is conducting, and a second region 19 that has hydrogen surface terminating groups 13b, such that it is semiconducting. FIG. 2A shows the junction where the second region 19 has p-type band alignment, and FIG. 2B shows the junction with n-type band alignment in the second region.

The x-axis of the plot is the length of the nanowire 1, and the y-axis is energy.

The top most line represents the vacuum level 33 of the band diagram. The shaded region 31 schematically shows the electron occupation of the nanowire 1. A Fermi level 35 is defined as the energy at which electronic occupation probability is 50% (at thermodynamic equilibrium), according to a Fermi-Dirac distribution. The position in energy of the Fermi level 35 across the junction is determined by the charge transfer taking place near the junction and will depend on the values of the work function 37 of the metallic region 17, and the electron affinity 43 of the semiconducting region 19.

Within the first region 17, which is metallic, states are occupied according to a Fermi-Dirac distribution characterised by the temperature of the system and the Fermi level. There is a continuum of available unoccupied electronic states around the Fermi level 35 and higher energies.

In the second region 19, a bandgap 39 with no available energy states is formed between the upper boundary 41 of the valence band 45 and the lower boundary 43 of the conduction band 47 in the semiconducting region.

Away from the boundary 21, the bands of the second region 19 are flat. However, at the boundary 21 (usually over the scale of a few nanometres), the bands 41, 43 of the semiconducting region 19 curve to balance charge near the interface 21, whilst preserving the bandgap 39.

The curving of the bands forms an interface region 51, and an energy barrier 49. In this interface region 51, there may be a portion of the valence band 45 that has unoccupied states.

In the absence of an external bias, the Fermi level 35 of the conducting region 17 region aligns within the bandgap 39 of the semiconducting region 19, defined away from the interface region 51, as shown in FIGS. 2A and 2B.

For forward bias above a threshold "turn-on" voltage, the barrier is lowered so that the electrons can pass from the second region 19 into the first region 17 (current direction C from the first region 17 into the second region 19). In reverse bias, the barrier 49 blocks electrons entering the second region 19 from the first region 17. Therefore, current can only pass in one direction along the x axis. This is an example of rectifying behaviour.

For sufficiently high reverse bias (the breakdown voltage), the conduction band of the second region 19 may align with the Fermi level 35 of the first region, allowing current to flow with reverse bias. This is known as the breakdown of rectifying behaviour.

The plots in FIGS. 2A and 2B show the characteristic features of a device known as a Schottky diode, this is an example of a rectifying junction.

Figure 3:
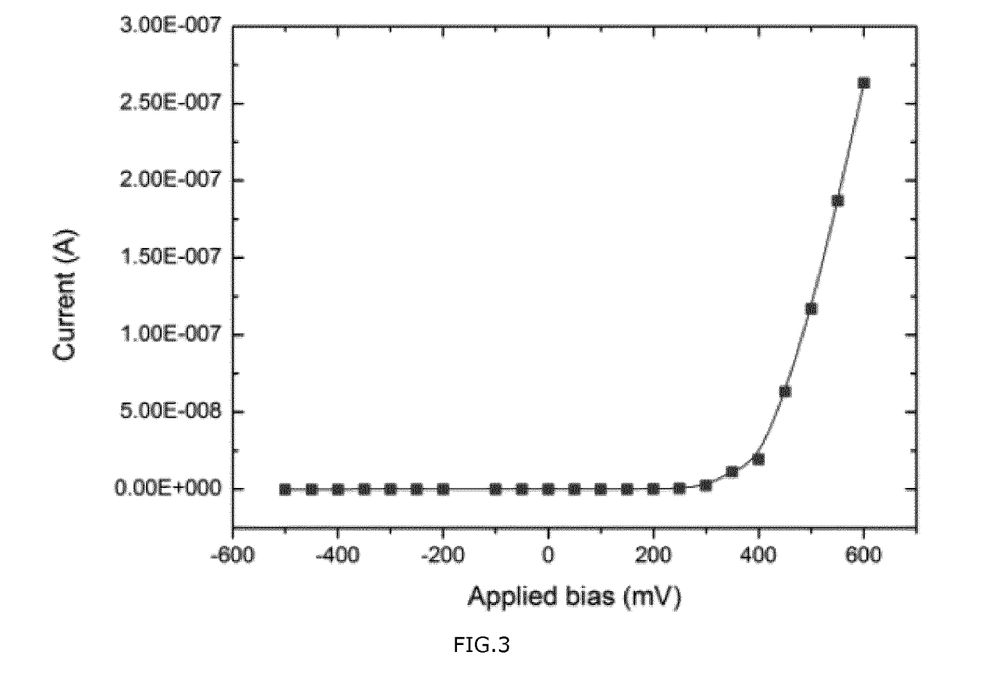
FIG. 3 schematically illustrates a current-voltage plot of a rectifying junction according to the invention.

FIG. 3 shows the current-voltage (I-V) characteristic for the alpha-tin nanowire 1 formed along the [110] axis, with 1 nm diameter. As can be seen, below the turn-on voltage (around 300 mV), only a small current passes. Above the turn-on voltage, the current increases exponentially.

As described above, a rectifying junction is a junction in which the current at a given voltage above the turn-on voltage in a first direction of bias (forward or reverse) is higher than the current at the same voltage in the opposite bias. The I-V characteristic shown in FIG. 3 is an example of good quality rectifying behaviour—the current in, in this case, forward bias is at least two orders of magnitude greater than the current in reverse bias. If the current in the opposite bias is less than two orders magnitude greater, the junction may still be considered rectifying, but does not show good rectifying characteristics.

The plots in FIGS. 2A, 2B and 3 are illustrative, and any nanowire 1 having a conducting region 17 and a semiconducting region 19, where the Fermi level of the conducting region aligns with the bandgap of the semiconducting region 19, will form a rectifying junction showing similar characteristics.

In the above, the rectifying junction 15 has been described in terms of a cylindrical nanowire 1 having a diameter, which is a quasi-one-dimensional cylindrical structure. It will be appreciated that the rectifying junction 15 may be formed in any other suitable shape of nanowire 1 having a diameter or thickness that causes the nanowire to exhibit quantum confinement. For example, the nanowire 1 may have a cross section that is square, rectangular, trapezoidal or triangular.

In further alternative examples, any suitable system with reduced dimensionality (one or two dimensional) with a dimension small enough in at least one direction to exhibit sufficient quantum confinement to form a bandgap and be semiconducting may be used.

Furthermore, in the above, the nanowire 1 has constant thickness, however, the diameter of the nanowire 1 may vary. The variation in diameter may be by design. For example, the nanowire 1 may taper over its whole length, or within a region, or may have a non-uniform diameter, which varies along its length.

The variation in diameter may also be unintentional. For example, non-uniformity in the manufacturing process, and variation in the position of atoms in the structure of the nanowire 1 may cause local changes in the diameter of the nanowire 1. In general, variation in the diameter caused by low (e.g. atomic) level variation is considered negligible, and so the example shown in FIG. 1A would be considered to have a constant diameter.

In any of the above examples, a conduction path is formed in the one dimensional system. When a bias is applied, the direction of current conduction C is in a direction perpendicular to the direction in which the size of the system is below the threshold required to exhibit quantum confinement. The rectifying junction 15 is arranged so that the direction of current conduction C crosses the junction 15, and so the surfaces provided with the terminating groups should be parallel with the direction of conduction C.

As discussed above, in the example of the nanowire 1, the confinement is along the diameter of the nanowire. The direction of current conduction C is along the length of the nanowire 1, and the rectifying junction 15 is across the width of the nanowire 1.

One example of an alternative system with reduced dimensionality that can be used is a thin film 23. A thin film 23 is a near planar structure 23. When the thickness of the thin film 23 is above a threshold thickness, the think film 23 exhibits the bulk properties of the material it is made from. Below the threshold thickness, the thin film exhibits quantum confinement. A thin film 23 is generally considered to extend infinitely along the two directions perpendicular to the thickness 27

Figure 4:
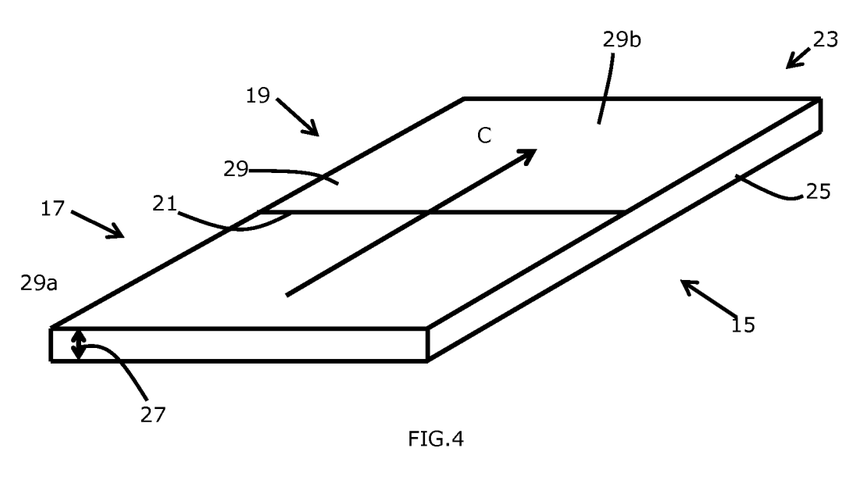
FIG. 4 illustrates a schematic representation of a thin film incorporating a rectifying junction according to the invention.

FIG. 4 shows a rectifying junction 15 formed in a thin film having a thickness 27 below the threshold required to exhibit quantum confinement. On the surface 29 of the thin film 23, there are surface bonds 11 in a similar manner to the nanowire 1.

Therefore, in a similar manner to the nanowire 1, a rectifying junction 15 can be formed at the boundary 21 between a first region 17 that has surface terminating groups that change the thin film 23 to conducting, and a second region 19 that has surface terminating groups that keep the thin film 23 semiconducting.

The thin film 23 may be made of the same materials as the nanowire, and similar terminating groups may also be used. The effect of the terminating groups on the bandgap and Fermi level is the same for the thin film 23 and the nanowire 1.

As discussed in relation to the diameter 7 of the nanowire 1, the thickness 27 of the thin film 23 may vary, intentionally or unintentionally.

In both of the above examples, the electrical characteristics of the rectifying junction 15 can be designed based on the choice of material, the size of the material in the dimension that is below the threshold required to exhibit quantum confinement, and the choice of terminating groups.

In the above examples, each region 17, 19 contains only a single terminating group. However, it will be appreciated that in some examples, each region 17, 19 may contain a mixture of different terminating groups, allowing the electrical characteristics to be controlled further. In some examples, all terminating groups in a region 17, 19, may have the same effect on the bandgap (i.e. they will all reduce or increase the bandgap to different degrees). However, in other examples, a single region 17, 19 may include a mixture of groups that increase the bandgap, and groups the reduce it or maintain it. For example, a region 17, 19 may have hydrogen and fluorine. The relative proportions of the different terminating groups can be set to help control the final bandgap of the region.

In some examples, the different terminating groups within a region 17, 19 may be intermixed over the surface of the region 5, 29 to provide the desired conducting properties (such as band gap). In other examples, the different groups may be arranged in patterns to provide the desired properties. For example the different groups may be arranged in stripes, or spots of one terminating group in a sheet of a second terminating group.

In the examples shown, the boundary 21 between the first region 17 and the second region 19 is perpendicular to the direction of current conduction C. However, it will be appreciated that the boundary 21 may be oblique to the direction of current conduction C. Furthermore, the surface may not be exactly parallel to the direction of current conduction C, and the dimension below the threshold size may not be exactly perpendicular to the direction of current conduction C. However, the dimension below the threshold size will be substantially perpendicular to the direction of current conduction, and the surface will be substantially parallel, such that the boundary 21 is formed across the path.

Furthermore, it will be appreciated that in the examples discussed above, the current transport direction C is lateral transport through the device. In some examples, the transport direction C may be vertical.

In the examples shown above, the boundary 21 between the first region 17 and the second region 19 is a sharp boundary. However, it will be appreciated that the boundary may not be so sharp. The sharpness of the boundary 21 will be determined by the techniques used to manufacture the rectifying junction 15 (discussed below). In some examples, the boundary may also be graduated by gradually altering the composition of the terminating groups.

The band diagrams shown in FIGS. 2A and 2B are shown by way of example only, and has been simplified for illustrative purposes. The band diagram may have any suitable form showing a barrier 49, with the Fermi level 35 of the conducting region aligned within the bandgap 39 of the semiconducting region 19. Furthermore, the bands may be formed of any number of sub-bands.

In the above examples, the nanowire 1 or thin film 23 has terminating groups terminating surface bonds 11. The effect of this is to passivate the surface of the nanowire 1 or thin film 23. It will be appreciated that any suitable structure that passivates the surface and achieves the desired modification in bandgap can be used. For example, a passivating layer of material may be formed over the surface. The passivation will form interfacial bonds with the surface of the nanowire 1. The interfacial bonds will still be considered surface bonds 11, at the surface of the nanowire. The passivating layer may be formed of the same materials as the terminating group.

Furthermore, in some examples, the atoms of the terminating group 13 or passivating layer may be able to form more than one bond to the nanowire 1, allowing a single atom or group to passivate more than one surface bond, or form part of a larger structure.

The rectifying junction 15 has also described in terms of negative charge carriers, however, it will be appreciated that charge transport may also be through positive carriers.

It will be appreciated that any suitable technique may be used for forming the one dimensional structure. Furthermore, any technique may be used to chemically modify the surface by changing the terminating groups, if required.

In some examples, a section of the material may be deposited or grown (for example by an epitaxial or crystal growth process) and then etched or treated in some other way to reduce it to below the threshold for showing quantum confinement in the required direction. In other examples, the material may be grown or deposited at the required size.

Any suitable lithographic techniques may be used to form the different regions 17, 19, and to provide the correct surface terminations. This may optionally include a surface treatment stage to ensure a clean surface.

In the above, the nanowire 1 or thin film 23 is described as being formed from a single semimetal material. It will be appreciated that this will include any natural variation in the composition or structure, impurities, and the like.

The procedure needed to determine the threshold size at which there is sufficient quantum confinement for the material to become semiconducting will be apparent to the person skilled in the art. For example, DFT calculations may be used to determine the variation of the band structure at room temperature, as a function of the dimensions of the material. This can be used to determine the threshold size at which a material starts to exhibit a bandgap, and hence semiconducting properties. It will be appreciated that DFT can underestimate the bandgap. It will also be appreciated that other bandgap calculations, or direct measurements of the bandgap, may also be used.

Rectifying junctions 15 are the building blocks of many different electronic devices. The rectifying junction 15 described above may be used in any number of such devices. Several different devices incorporating such a rectifying junction 15 are described below, as illustrative examples.

In one example, the nanowire 1 or thin film 23 may be used as a diode. This can be achieved simply by providing suitable electrical connections to the conducting region 17 and the semiconducting region 19.

In other examples, the nanowire or thin film may be used in a field effect transistor (FET).

FETs are the building blocks of many different integrated circuit devices. There is ongoing interest in reducing the size of FETs, because smaller FETs allow higher FET density and consequently higher function per unit area at lower unit cost.

Typically, FETs have a channel 106 extending between a source 102 and a drain 104. Conduction along the channel 106 can be turned on or off, or modulated, by a gate 108, which shifts the alignment of the conduction and valence bands of the channel 106 relative to the source 102 and drain 104.

The most widely used FET is the metal-oxide-semiconductor FET (MOSFET). In modern microprocessors, MOSFETs are predominantly used for switching. While an ideal switch provides an abrupt transition from the OFF state to the ON state at room temperature, there is a physical limit for the switching slope, as the MOSFET is scaled down in size.

To overcome the physical limit of the switching slope, tunnel-FETs (TFETs) have been developed. TFETs based on doping changes and/or heterojunctions formed between different materials can improve switching performance. However, constructing nano-scale heterojunction based TFETs using different materials and/or with different dopant types imposes critical challenges in the device fabrication.

Figure 5A:
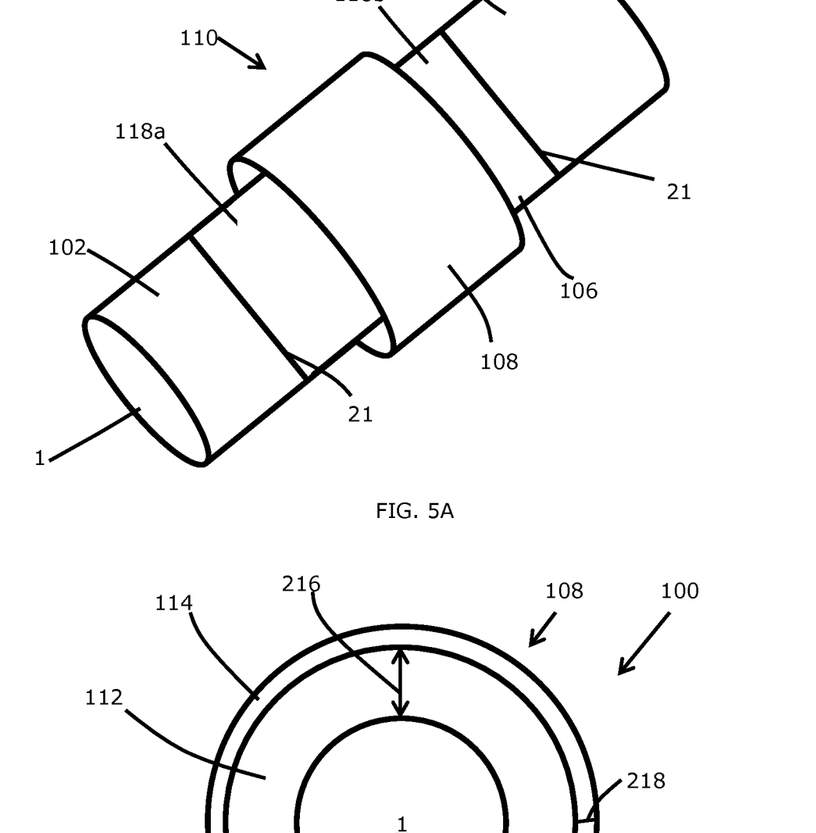
FIG. 5A illustrates a first schematic example of an electronic device formed in a nanowire including at least one rectifying junction according to the invention.
Figure 5B:
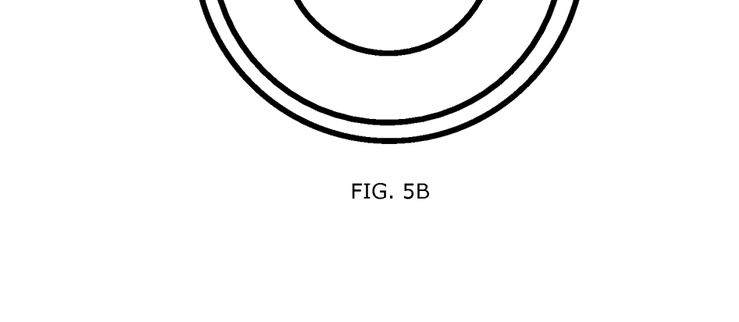

FIGS. 5A and 5B and 7(a) shows an example of a FET 100 formed from a nanowire 1. The FET 100 has a source 102, a drain 104, and a channel 106 extending between the source 102 and the drain 104 A gate 108 is provided, which can be used to control conduction of carriers along the channel 106.

The nanowire 1 forming the FET 100 has a diameter below the threshold size required to exhibit quantum confinement along its whole length. The surface bonds of the source 102 are passivated by terminating groups 13 that make the source 102 conducting. The surface bonds of the channel 106 and drain 104, on the other hand, are passivated by terminating groups 13 that make them semiconducting. Therefore, the boundary between the source 102 and the channel 106 is a rectifying junction 15 as discussed above.

The drain 104 is doped, which narrows the bandgap between the conduction band and valence band, causing offsets between the conduction and/or valence bands at the boundary between the channel 106 and the drain 104. The offsets provide a tunnel junction between the drain 104 and the channel 106.

Figure 6:
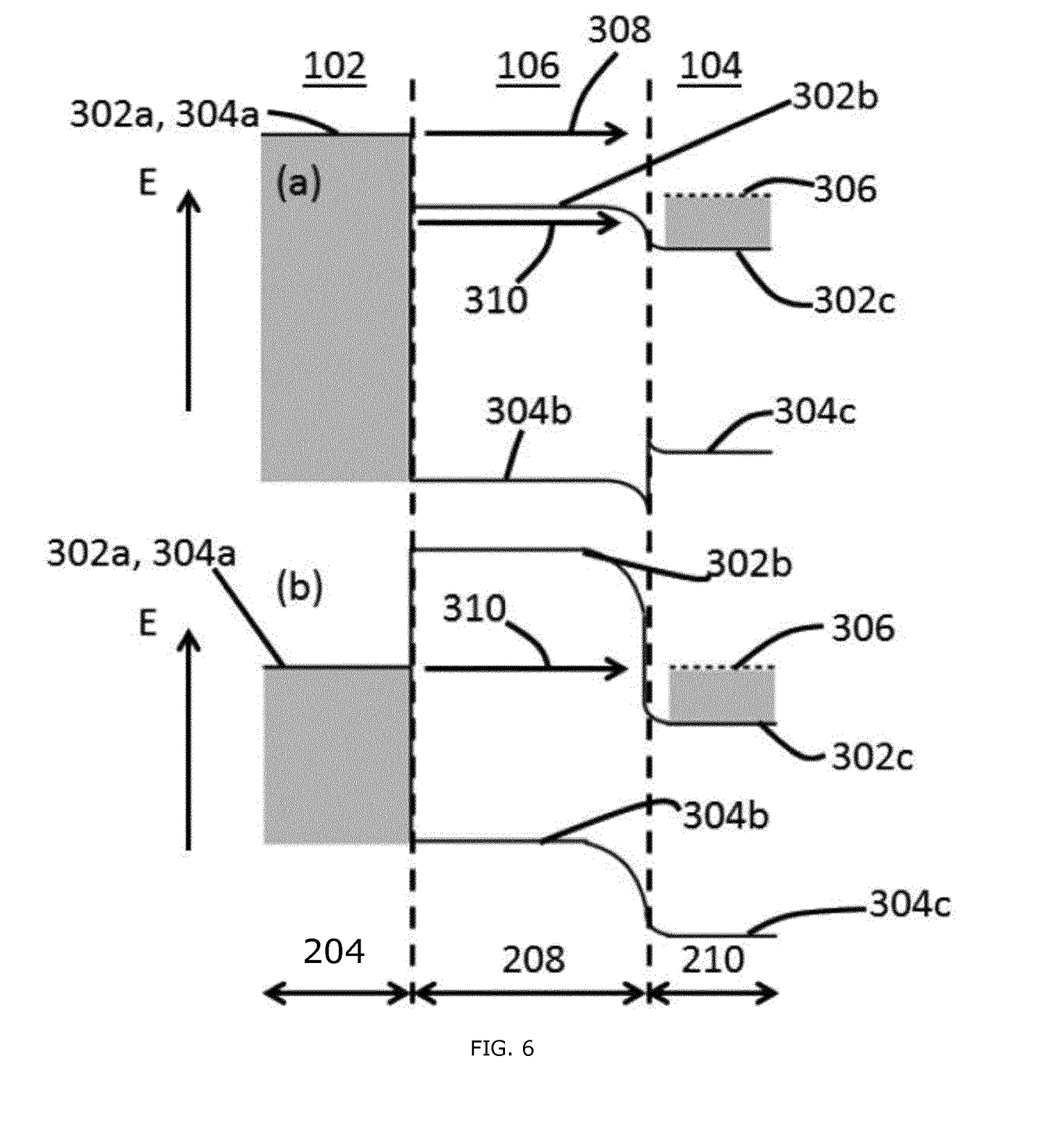
FIG. 6 illustrates a schematic example of an energy level diagram of the device in FIGS. 5A and 5B.

FIG. 6 shows an example of the relative alignments of the conduction band 302 and valence band 304 along the length of the nanowire 1, with band offsets in both the conduction band and valence band. The band diagram shows the lower edge of the conduction band 302 and the upper edge of the valence band 304.

The source 102 is metallic or semimetallic. Electrons occupy the band up to a Fermi level, as shown by the shading.

In the channel 106, there is a bandgap between the channel valence band 304b, and the channel conduction band 302b. The drain 104 has a band offset provided between the drain valence band 304c and the drain conduction band 302c. The drain 104 is arranged (for example through the choice of doping, surface passivation and the like) to have a Fermi level higher than the lower edge of the drain conduction band 302c. The band structure of the drain 104 is occupied by electrons up to the Fermi level 306, as shown by the shading.

The upper part (a) of FIG. 6 shows the band alignments in the ON state, while the lower part (b) shows the band alignments in the OFF state.

In the ON state, a first voltage is applied to the gate 108, which shifts the channel conduction band 302b and the channel valence band 304b into alignment with the drain conduction band 302c and the drain valence band 304c, and which shifts the lower edge of the channel conduction band 302b below the occupation level of the source 102.

In the ON state, the current transport mechanism is:
Conduction 308 from the source 102 to the drain conduction band 302c, through the channel conduction band 302b; and
Short channel tunneling 310 from the source 102 to the drain conduction band 302c, across the bandgap in the channel 106.

The electron transport 308 through the conduction band 302 is significantly larger than the short channel tunneling 310, and is the dominant transport process. In the ON state, the short channel tunneling 310 may be considered negligible.

The first voltage is the same, or higher than, a threshold voltage required to turn the TFET into the ON state. The threshold voltage is the lowest voltage at which tunneling 308 through the conduction band 302 occurs.

In the OFF state, a second, different, voltage is applied to the gate 108. In the OFF state, the channel conduction band 302b is shifted above the occupation level of the source 102. The bandgap of the channel 106 is unchanged so the channel valence band 304b also shifts.

In the OFF state, the direct tunneling is suppressed due to the band offset between the source 102 and the channel 106, and short channel tunneling 310 is the dominant component of the current. This can be reduced by increasing the channel length 208, and so can be considered negligible in some cases, as the probability of tunneling decreases.

The first and second voltages may be any suitable value (including 0 V).

FIG. 7(a) schematically shows the TFET 100a described above. The first type of terminating group 13a, which closes the bandgap so that the material becomes conducting is labelled "A" and the second type of terminating groups 13b, which maintain the semiconducting behaviour is labelled "B".

FIG. 7(b) shows an alternative example of a TFET 100b. Again, the source 102, channel 106 and drain 104 are below the threshold size. In this example, the surface of the source 102 and channel 106 are passivated with the second type of terminating group 13b and so the source 102 and channel 106 are semiconducting. The surface of the drain 104 is passivated with the first type of terminating group 13a, so the drain 104 is conducting, and a rectifying junction as described above is formed between the drain 104 and channel 106. In this example, the source 102 is doped, so a tunnel junction is formed between the source 102 and channel 106.

In the above examples, the source 102 or drain 104 can be doped, with either n-type dopant or p-type dopant, and the remainder of the nanowire 1 is intrinsic (undoped) material. The doping concentration in the doped region is between $10^{14}$ atoms/cm$^3$ and $10^{23}$ atoms/cm$^3$. Ideally this doping concentration is above $10^{20}$ atoms/cm$^3$, although this is not essential. The dopant can be introduced by any suitable doping technique. A sharp (abrupt) boundary is formed between the doped and undoped regions.

There may be dopant present on the channel 106 side of the doping boundary. This may be from diffusion of dopant out of the doping region, or from unintentional doping of the channel 106 (for example impurities and the like). The dopant in the channel 106 may be the same as, or different from, the dopant in the drain 104.

In general, on the undoped side of the doping boundary, the doping concentration is below a threshold amount, while on the doped side of the boundary, the doping is above the threshold amount. The doping on the undoped side of the boundary is preferably at least five orders of magnitude below the doping concentration on the doped side, and so can be considered negligible, and has negligible effect.

Any suitable dopant may also be used depending on the nanowire composition. For the specific case of nanowires made of group IV elements, any group III element may be used for p-type dopant, and any group V element may be used for n-type dopant. For example, the dopant may be indium (p-type) and antimony (n-type).

Similarly, any doping boundary, if present may be formed from a gradual change in doping concentration, rather than an abrupt change, providing the carrier injection is sufficient to form a junction.

The above examples show bandgap narrowing in the doped region compared to the channel 106. The bandgap narrows when the doping level is sufficiently high. In nanoscale devices, a relatively low number of dopant atoms is sufficient to cause bandgap narrowing, compared to the number of dopant atoms required in larger scale devices. However, it will be appreciated that in some examples the doped and undoped regions may have the same bandgap. Where the bandgap in the channel 106 is the same as the doped region, the doping boundary may shift the conductance band and/or valence band without altering the bandgap, to obtain the desired offset(s). The gate voltage may also be used as well as or instead of this.

FIGS. 7(c) to 7(e) show examples of another type of FET that can be formed in a nanowire 1. These examples are all Schottky Barrier FETs (SBFETs) 200. In the SBFETs, the source 102 and drain 104 are both conducting, and the channel 106 is semiconducting, so rectifying junctions 15 as described above are formed between the source 102 and the channel 106 and the channel 106 and the drain 104.

A first example of an SBFET 200a is shown in FIG. 7(c). In this example, the source 102, channel 106 and drain 104 are all smaller than the threshold size. The source 102 and drain 104 are made conducting by passivating the surface bonds with the first type of terminating group 13a. The channel is made semiconducting by passivating the surface bonds with the second type of terminating group 13b.

In a second example of an SBFET 200b, shown in FIG. 7(d), the channel 106, and the drain 104 are smaller than the threshold size. The drain 104 is made conducting by passivating the surface bonds the first type of terminating group 13a, and the channel 106 is made semiconducting by passivating the surface bonds with the second type of terminating group 13b. However, the source 102 is larger than the threshold size, and conducting for this reason. Any surface terminating group may be used in the source 102, since the size overrides the effect of any surface terminating group.

In a third example of an SBFET 200c, shown in FIG. 7(e), the source 102 and channel 106 are smaller than the threshold size. The source 102 is made conducting by passivating the surface bonds the first type of terminating group 13a, and the channel 106 is made semiconducting by passivating the surface bonds with the second type of terminating group 13b. In this example, the drain 104 is larger than the threshold size, and conducting for this reason. Any surface terminating group may be used in the drain 104, since the size overrides the effect of any surface terminating group.

Referring to FIGS. 5A and 5B, the channel 106 between the source 102 and the drain 104 is comprised of a gate overlapped region 110, where the gate 108 overlies the channel 106, a source-channel interface region 118a, between the source 102 and the gate overlapped region 110, and a drain-channel interface region 118b, between the gate overlapped region 110 and the drain 104.

The gate overlapped region 110, and hence the gate 108 has a gate length along the length of the nanowire 1. The source-channel interface region 118a and drain-channel interface region 118b have respective interface lengths. The channel length 208 is the sum of the gate length, the first interface length, and the second interface length.

In any of the above examples, the source 102 has a source length 204 along the length of the nanowire 1. The drain 104 has a drain length along the length of the nanowire 1. These are shown schematically in FIG. 6.

Although this is described in relation to a FET 100, it also applies to an SBFET 200.

In general, the source length 204, the source-channel interface length, the gate length, the drain-channel interface length, and the drain length 210 may be greater than a few atomic layers and of unlimited length. For example, the source length 204, the source-channel interface length, the gate length, the drain-channel interface length, and the drain length 210 may be between 1 nm and 10 microns.

The gate 108 is formed of a dielectric region 112 provided around the channel 106, and a gate electrode 114 provided on top of the dielectric region 112. The dielectric region 112 has dielectric thickness 216, and a dielectric constant greater than 1 and as large as possible. The electrode 114 has an electrode thickness 218.

The dielectric thickness 216 and electrode thickness 218 may be greater than a few atomic layers and of unlimited thickness. For example, the dielectric thickness 216 and electrode thickness 218 may be between 1 nm and 5 microns.

The dielectric region 112 may be formed of any form of insulator, such as silicon dioxide, silicon oxide, silicon monoxide, or any form of nitride, including silicon nitride, silicon oxynitride, alkali halides (e.g., rubidium bromide and lithium fluoride), barium titanate ($BaTiO_3$), lead titanate ($PbTiO_3$), or any form of metal oxides (e.g., hafnium oxide, tantalum oxide, tungsten oxide and zirconium oxide). The electrode 114 may be formed of any metal or doped/undoped polysilicon, poly SiGe, Nickel (Ni) silicide, or graphene.

The person skilled in the art will also appreciate that there are many suitable methods for making electrical connections to the terminals of an electronic device (the conducting region 17 and semiconducting region 19 of a diode, or the source 102, drain 104 and gate 108 of a FET 100, 200). They will also appreciate that many thousands (or more) of diodes or FETs 100, 200 may be provided on a single chip in a circuit, and the FETs 100, 200 may be interconnect using known methods.

The above examples which incorporate a change in the size of the nanowire 1 show an abrupt change in diameter, which forms a right angle (90 degrees). However, the person skilled in the art will appreciate that there may not always be such an abrupt change. The change in size may be graded along an angle, which may be smaller or larger than 90 degrees. This may be, for example, a result of limitations in the etching or lithography procedure or material growth/deposition conditions. Alternatively, the graded change in diameter could be by design. The change in diameter should be sufficiently abrupt that the first-quasi junction forms a junction having sufficient carrier injection.

In the examples discussed, the source 102, drain 104 and the channel 106 each have constant diameter. However, as discussed above in relation to the nanowire 1 and thin film 23, it will be appreciated that the diameter may vary within the different regions or over the whole device, provided the regions remain above or below the threshold diameter, as required.

Also, in the above examples of a FET 100, 200, the regions below the threshold size required to exhibit sufficiency quantum confinement to be semiconducting all have the same diameter. However, in some examples, the different regions may have different diameters, below the quantum confinement threshold.

It will also be appreciated that the required band offsets may be obtained by a combination of doping and surface modification.

In the example FETS 100 shown, the gate 108 is an all-around gate, which is provided around the circumference of the nanowire 1, along the gate length 208. However, it will be appreciated that the gate may be a multi-gate, tri-gate, Omega structure or double gate. Furthermore, the dielectric 112 may extend further along the channel 106 than the electrode 114, allowing the gate dielectric 112 to perform a surface passivation function. In one example, the gate dielectric 112 runs the full length of the channel 106. In these examples, the gate length will be considered as the length of the electrode 114.

In the above examples, the gate 108 overlaps a portion of the channel 106, with interface regions 118 between the overlapped region and the source 102 and drain 104. It will be appreciated that in some examples, one or both of the interface regions 118 may be omitted. In some cases, the gate 108 may overlap the whole length of the channel 106 and may extend into one or both of the source region 104 and the drain region 108 in an overlap configuration.

In the above example, the dielectric thickness is constant. However, in other examples, the dielectric thickness may vary along the length of the channel 106. The electrode thickness may also vary along the channel 106.

The nanowire diode or FET 100, 200 may be formed from any of the materials discussed above in relation to the nanowire 1.

In some examples, the diode or FET 100, 200 may be formed from a composition of different materials. For example, the source 102, channel 106 and drain 104, may all be formed of different materials, the source 102 and drain 104 may be formed of a first material, and the channel 106 formed from a second material, or the channel 106 may be formed of the same material as one of the source 102 or drain 104, with the other being formed from a different material. In all cases, the channel 106 is formed of a material that behaves as a metal or semimetal in the bulk, and a semiconductor once sufficient quantum confinement is present.

Figure 7:
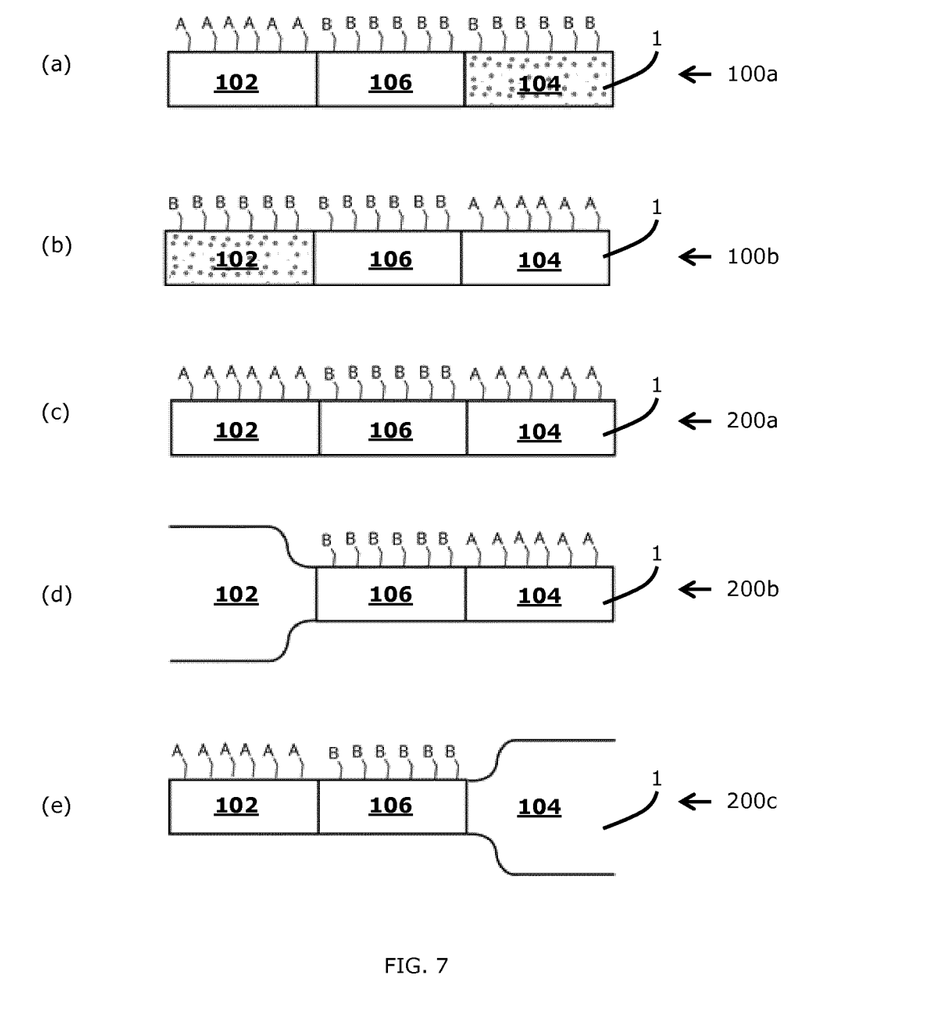
FIG. 7 illustrates five examples of FETs formed using at least one rectifying junction according to the invention.

It will also be appreciated that the devices discussed in relation to nanowires in FIGS. 5 to 7 can be implemented in thin films 23, or any other system of reduced dimensionality.

The invention claimed is:

1. A rectifying Schottky barrier junction formed in a conduction path provided in a material that behaves as a semimetal in the bulk, wherein:
   the material has a length along which the conduction path extends, and a thickness or diameter;
   the thickness or diameter is smaller than a threshold size, the threshold size being the size at or below which the material exhibits quantum confinement such that the length of material forms a bandgap and behaves as a semiconductor, wherein the threshold size is the same as or less than a Fermi wavelength of charge carriers in the material;
   bonds at a surface of a first region of the length of material are arranged to decrease the bandgap of the first region such that the first region reverts to semimetallic behaviour; and
   bonds at a surface of a second region of the length of material are arranged to preserve the bandgap of the second region such that the second region maintains semiconducting behaviour,
   wherein the second region is contiguous to the first region, such that a rectifying junction is formed at a boundary between the first region and the second region.

2. The rectifying junction of claim 1, wherein the surface of the first region and the surface of the second region extend at least substantially parallel to the conduction path, and the path is provided in:
   a circular cross-section nanowire having diameter less than the threshold size and a length; or
   a non-circular cross section nanowire with associated widths less than the threshold size and a length; or
   a thin film having a thickness below the threshold size, and a length.

3. The rectifying junction of claim 1, wherein the material is an elemental semimetal, compound semimetal, or alloy of two or more materials that behave as a semimetal when the size of the material is above the threshold size to observe quantum confinement.

4. The rectifying junction of claim 3, wherein the material is selected from a list including: alpha-tin, arsenic, graphite, antimony, bismuth, mercury telluride, and tin-germanium alloy.

5. The rectifying junction of claim 1, wherein bonds at the surface of the first region are terminated by terminating groups or a passivating layer arranged to decrease the bandgap of the material in the first region.

6. The rectifying junction of claim 5, wherein the terminating group or passivating layer is arranged to decrease the bandgap of the material in the first region is one or more of: Fluorine, or hydroxyl.

7. The rectifying junction of claim 1, wherein bonds at the surface of the second region are terminated by terminating groups or a passivating layer to narrow, maintain or widen the bandgap of the material in the second region, such that the second region maintains semiconducting behaviour.

8. The rectifying junction of claim 7, wherein the terminating group or passivating layer is arranged to narrow, maintain or widen the bandgap of the material in the second region is one or more of: methyl groups, or hydrogen.

9. The rectifying junction of any of claim 1, wherein bonds on the surface of the first region and/or the second region are terminated by a mixture of terminating groups or passivating layers arranged to decrease the bandgap of the material, and terminating groups or passivating layers arranged to maintain or widen the bandgap of the material, in order to tune the bandgap of the first region and/or the second region.

10. An electronic device comprising at least one rectifying junction as claimed in claim 1.

11. The electronic device of claim 10, wherein the electronic device is a diode or a field effect transistor.

12. The electronic device of claim 11, wherein the electronic device is a field effect transistor having a channel region extending between a source region and a drain region, and wherein the junction between the source region and the channel region and/or the junction between the drain region and the channel region is formed by a rectifying junction as claimed in claim 1, and wherein the surface of the channel region is arranged such that the channel region is semiconducting.

13. The electronic device of claim 12, wherein the electronic device is a field effect transistor, and wherein:
   bonds at a surface of one of the source region and the drain region are arranged to be semimetallic, such that a rectifying junction as claimed in claim 1 is formed between the one of the source region and drain region and the channel region;
   bonds at a surface of the other of the source region and the drain region are arranged to be semiconducting; and wherein
   the other of the source region and the drain region is doped to alter the band alignment such that a tunnel junction is formed between the channel region and the other of the source region and the drain region.

14. The electronic device of claim 12, wherein the electronic device is a Schottky barrier field effect transistor, and wherein:
   the thickness or diameter of the channel region and one of the source region and the drain region is smaller than the threshold size;
   bonds at a surface of the one of the source region and the drain region are arranged to decrease the bandgap of the material such that the conduction path is semimetallic in the one of the source region and the drain region, such that a rectifying junction is formed between the one of the source region and drain region and the channel region; and
   the thickness or diameter of the other of the source region and the drain region is larger than the threshold size, such that it is semimetallic.

15. A method of forming a rectifying Schottky barrier junction comprising:

providing a material with a length and a thickness or diameter, the thickness or diameter being smaller than a threshold size, the threshold size being the size at or below which the material exhibits quantum confinement such that the length of material forms a bandgap and behaves as a semiconductor, wherein the threshold size is the same as or less than a Fermi wavelength of charge carriers in the material;

arranging bonds at a surface of a first region of the length of material to decrease the bandgap of the first region, such that the first region reverts to semimetallic behaviour; and arranging bonds at a surface of a second region of the length of material to preserve the bandgap of the second region, such that the second region maintains semiconducting behaviour, wherein the second region is contiguous to the first region, such that a rectifying junction is formed at a boundary between the first region and the second region.

16. The method of claim 15, wherein providing a material with a thickness or diameter that is smaller than a threshold size comprises:

providing the material with a thickness or diameter that is larger than the threshold size and reducing the thickness or diameter of the material, such that it is smaller than the threshold size.

17. The method of claim 15, wherein arranging bonds at a surface of a first region and/or arranging bonds at a surface of a second region includes:

chemically modifying the surface of the first region and/or the surface of the second region to modify the passivation of the bonds on the surface of the first region and/or second region.

18. The method of claim 17, wherein chemically modifying the surface of the first region comprises:

providing terminating groups or a passivating layer to passivate the bonds on the surface of the first region, the terminating groups arranged to decrease the bandgap of the material in the first region, such that the first region is semimetallic.

19. The method of claim 17, wherein chemically modifying a surface of the second region comprises:

providing terminating groups or a passivating layer to passivate the bonds on the surface of the second region, the terminating groups arranged to maintain or increase the bandgap of the material in the second region, such that the second region is semiconducting.

* * * * *